United States Patent [19]

Nakatani et al.

[11] Patent Number: 5,407,511

[45] Date of Patent: Apr. 18, 1995

[54] PROCESS FOR FORMING A SINTERED CONDUCTOR CIRCUIT BOARD

[75] Inventors: Seiichi Nakatani, Osaka; Masahide Tsukamoto, Nara; Mikinari Shimada, Kyoto, all of Japan

[73] Assignee: Matsushita Electric Industrial Co., Ltd., Osaka, Japan

[21] Appl. No.: 214,267

[22] Filed: Mar. 17, 1994

Related U.S. Application Data

[62] Division of Ser. No. 836,575, Feb. 18, 1992.

[30] Foreign Application Priority Data

Feb. 19, 1991 [JP]  Japan ................... 3-024427

[51] Int. Cl.$^6$ ................... B44C 1/165; B32B 31/00
[52] U.S. Cl. ................... 156/230; 156/235; 156/240; 156/289; 156/902
[58] Field of Search ............ 156/89, 230, 233, 235, 156/240, 241, 289, 631, 901, 902; 29/846, 852; 427/96, 97; 174/262; 428/546, 551, 901

[56] References Cited

U.S. PATENT DOCUMENTS

| | | | |
|---|---|---|---|
| 3,264,402 | 8/1966 | Shaheen et al. | 156/901 X |
| 4,164,071 | 8/1979 | Kruzich . | |
| 4,465,727 | 8/1984 | Fujita et al. . | |
| 4,581,098 | 4/1986 | Gregor | 156/635 |
| 4,584,039 | 4/1986 | Shea | 156/150 |
| 4,751,126 | 6/1988 | Oodaira et al. . | |
| 4,914,260 | 4/1990 | Suzuki et al. . | |
| 5,162,240 | 11/1992 | Saitou et al. . | |

OTHER PUBLICATIONS

H. Ohdaira, "Plastic Multilayer Wiring Boards", Toshiba Review, vol. 45, No. 12, 1990, pp. 974–976.
M. Aoki et al., "Copper-Clad Laminates for Printed Wiring Boards", Toshiba Review, vol. 45, No. 12, 1990, pp. 980–982.
Tsukada, SLC (Surface Laminar Circuit), Surface Mounting Technology, 1991, pp. 28–34. Coble et al., "Sintering in Ceramics", *Progress in Ceramic Science*, vol. 3, 1963, p. 199.

*Primary Examiner*—William Powell
*Attorney, Agent, or Firm*—Lowe, Price, LeBlanc & Becker

[57] ABSTRACT

A circuit board that is made compact or highly dense and can be prepared using no chemical etching is obtained by patternwise printing a sinterable conductor on a releasing substrate, sintering the conductor by heating at a given temperature, and transferring the sintered conductor to a resin support. A plurality of sintered conductors each prepared by the above process may be laminated to give a multi-layered circuit board.

10 Claims, 3 Drawing Sheets

PROCESS FOR FORMING A SINTERED CONDUCTOR CIRCUIT BOARD

This application is a division of application Ser. No. 07/836,575, filed Feb. 18, 1992.

BACKGROUND OF THE INVENTION

1. Field of the Invention

This invention relates to a sintered conductor circuit board on which LSIs or chip components are mounted and through which they are mutually connected.

2. Description of the Prior Art

Recently, a reasonably large number of functions can be achieved using an electric circuit, and accordingly the electric circuit has become complicated, resulting in a considerable increase in the number of electronic parts. For this reason, circuit boards have also become complicated and have become required to be made compact. In order to settle these subjects, the wiring or circuit density has become increasingly higher and at the same time a tendency toward a multi-layered circuit board has come to be seen.

A conventional process of fabricating multi-layered circuit boards comprises chemically etching (or photoetching) a copper foil on a resin support to form a pattern, laminating a plurality of the patterned foil, making a hole through the laminate in its thickness direction, and plating the inner wall of the hole (through-hole) so that the layers of the laminate can be mutually connected.

Since the through-hole is made using a drill, it can have a diameter of about 300 μm at best. Since also the layers are connected by plating, a severe precision is required for the positional precision between layers and the shape of the inner wall of the through-hole, where an increase in the number of the layer results in a poor yield. Increasing the number of the layers for the purpose of a higher circuit density may also result in an increase in the number of the through-hole that connects such layers, rather making the wiring space smaller. This brings about a difficulty for achieving a higher circuit density. In addition, industrial waste of an etchant or the like used during fabrication has been problematic. The fabrication also has required a lengthy process, resulting in a high fabrication cost.

SUMMARY OF THE INVENTION

An object of the present invention is to provide a circuit board that can be made compact or highly dense, may require no chemical etching and can promise a low fabrication cost.

Another object of the present invention is to provide a multi-layered circuit board that can achieve a high-density wiring not relying on the through-hole but making use of a perfect inner via hole.

To achieve the above objects, the circuit board of the present invention is a circuit board obtained by patternwise printing a sinterable conductor on a releasing substrate, sintering the conductor by heating at a given temperature, and transferring the sintered conductor to a resin support. Thus a sintered conductor circuit board comprising a resin support patternwise provided thereon with a sintered conductor can be obtained.

A double-sided sintered conductor circuit board can also be prepared using a resin support having a hole made therein, and patternwise providing a sintered conductor on each side of the resin support, which hole is filled with a conductive connecting material to electrically connect the sintered conductor on each side.

A plurality of sintered conductors may be laminated and the layers of the laminate may be connected with a conductive connecting material through a hole to give a multi-layered circuit board.

The manufacturing process can be simple because no photoetching is used, and the positional precision between layers may be loosely managed, compared with fabrication of conventional circuit boards, to make it possible to readily obtain a multi-layered circuit board. The present invention not only can provide a high-density circuit board with a high precision, but also requires only a simple fabrication process, can be free from the step that produces any industrial waste, and can make fabrication equipment compact, thus achieving a low cost.

DESCRIPTION OF THE PREFERRED EMBODIMENTS

The sintered conductor circuit board of the present invention and a process for its fabrication will be described below with reference to the accompanying drawings.

Figure 1:
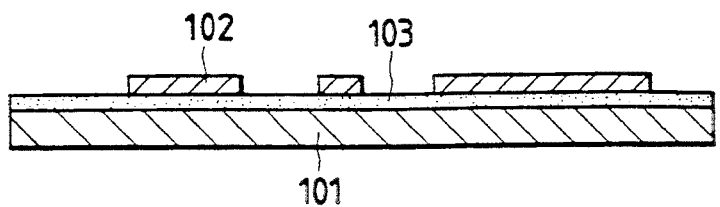
FIG. 1 is a cross section of the sintered conductor circuit board of the present invention.

FIG. 1 cross-sectionally illustrates an embodiment of the sintered conductor circuit board according to the present invention. In FIG. 1, reference numeral 101 denotes a resin substrate or support. Reference numeral 102 denotes patterned wiring formed of a sintered conductor, and is adhered onto the resin support 101 through an adhesive layer 103.

The resin support 101 may be made of polyimide or PET (polyethylene terephthalate). The conductor that constitutes the sintered conductor may include copper, gold and silver. The sintered conductor may be formed of any one of these conductors, or may be formed of two or more of these to give a multi-layered sintered conductor. The adhesive layer 103 may be made of epoxy resin, phenol resin, polystyrene resin or the like.

The sintered conductor circuit board can be fabricated, for example, in the following way:

To a releasing substrate made of, for example, boron nitride of a hexagonal system, a sinterable conductor paste is applied by screen printing in stripe lines with a stripe width of from 50 to 500 μm. After the conductor paste applied has been dried, the releasing substrate with the conductor pattern is heated in a furnace at a temperature of from 600° to 1,000° C. for 2 to 60 minutes in an atmosphere of an inert gas such as nitrogen. As a result, a pattern of the sintered conductor is formed without separation of the pattern from the substrate. The sintered conductor may be formed in a thickness of from 10 to 35 μm. The sinterable conductor paste used herein can be prepared, for example, by adding 0.5 to 5 parts by weight of a binder such as ethyl cellulose or polymethacrylate of layer alcohol to 100 parts by weight of an inorganic composition containing the above conductor, and dissolving the mixture in 5 to 20 parts by weight of a solvent such as terpinenol, an aliphatic alcohol or an aliphatic alcohol ester, to give a vehicle composition, followed by kneading using an kneader such as a three-roll mill.

Next, the resin support with the adhesive is superposed on the above releasing substrate with the sintered conductor pattern, which are then hot-pressed at a temperature of from 5° to 200° C. After cooling, the resin support is peeled from the releasing substrate, so that the former can be separated from the latter in the state that the sintered conductor pattern has adhered to the resin support, in other words, the sintered conductor pattern is transferred to the resin support.

Figure 2:
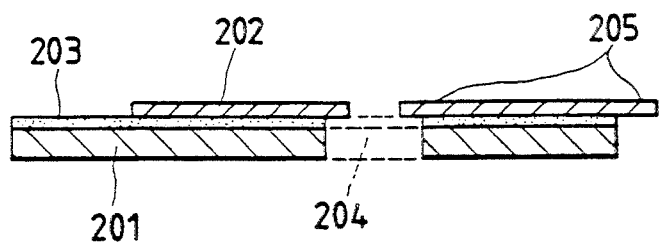
FIG. 2 is a cross section of a sintered conductor circuit board in which part of the sintered conductor protrudes from a resin support.

FIG. 2 cross-sectionally illustrates another embodiment of the sintered conductor circuit board in which part of the sintered conductor protrudes from a resin support.

The sintered conductor circuit board shown in FIG. 2 has the same basic structure as the one shown in FIG. 1, except that part of the sintered conductor protrudes from the resin support. Those having this shape are commonly called TAB (tape automated bonding). Reference numeral 201 denotes a resin support which may be made of the same material as the resin support 101 of the circuit board shown in FIG. 1. Reference numeral 202 denotes a sintered conductor, which may be comprised of the same materials as the sintered conductor 102 of the circuit board shown in FIG. 1. Reference numeral 203 denotes an adhesive layer which may also be made of the same material as the adhesive layer 101 of the circuit board shown in FIG. 1. In this embodiment, the sintered conductor 202 is so formed that part thereof protrudes from the resin support 203. Reference numeral 204 denotes a window through which an IC is attached. Reference numeral 205 denotes what is called a lead, which is utilized for electrical connection to an external circuit such as the IC.

Figure 3A:
FIGS. 3A to 3C illustrate a flow sheet to show a process of fabricating a sintered conductor circuit board according to the present invention.
Figure 3B:
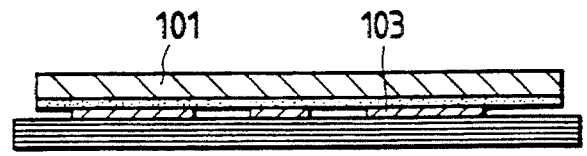
Figure 3C:
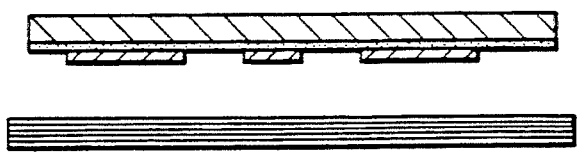

FIGS. 3A to 3C illustrate a flow sheet to show a process of fabricating the sintered conductor circuit board shown in FIG. 1 or 2. In FIG. 3A, reference numeral 301 denotes the releasing substrate previously described. The releasing substrate may preferably be made of a boron nitride of hexagonal system (h-BN). Alternatively, the releasing substrate may be those comprising an aluminum substrate patternwise coated thereon with a water-based graphite coating composition as exemplified by AQUADUG (trade name; available from Acheson Japan, Ltd.) followed by drying, which can similarly give the sintered conductor wiring and also has a good releasability when it is further patternwise coated with, e.g., a Cu paste, followed by drying and then sintering. Still alternatively, as the releasing substrate, it is also possible to use an aluminum substrate itself which is usually of wide use in hybrid ICs, which can be readily released under appropriate control of sintering conditions or the composition of the sinterable conductor paste.

Reference numeral 102 denotes the wiring formed of the sintered conductor, which has been sintered by applying the sinterable conductor paste on the above releasing substrate by screen printing or the like, followed by firing at the high temperature as previously described. The wiring may be formed of the sintered conductor with a high conductivity as previously exemplified by gold, silver and copper. The method of forming this wiring is well known to those skilled in the field of ceramics. Next, as shown in FIG. 3B, the resin support or substrate 101 having the adhesive layer 103 is superposed on the sintered conductor wiring, which are then hot-pressed at the temperature previously described. Thereafter, the resin support 101 is peeled from the releasing substrate, so that the sintered conductor wiring is transferred to the resin support by virtue of the adhesive layer 103 and releasing substrate 301. FIG. 3C illustrates the state the sintered conductor wiring has been transferred to the resin support. The releasing substrate 301 can be again used in further fabrication.

The sintered conductor circuit board shown in FIG. 2, provided with the lead 205, can be obtained by transferring the sintered conductor in such a way that it may protrude from the resin support in an appropriate length.

It is also possible to fabricate a double-sided sintered conductor circuit board, which is prepared by transferring the sintered conductor to both sides of the resin support of the sintered conductor circuit board shown in FIG. 1.

Figure 4A:
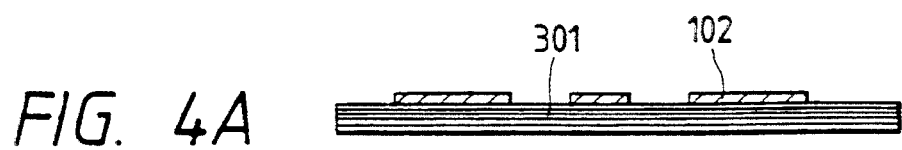
FIGS. 4A to 4E illustrate a flow sheet to show a process of fabricating a double-sided sintered conductor circuit board according to the present invention.
Figure 4B:
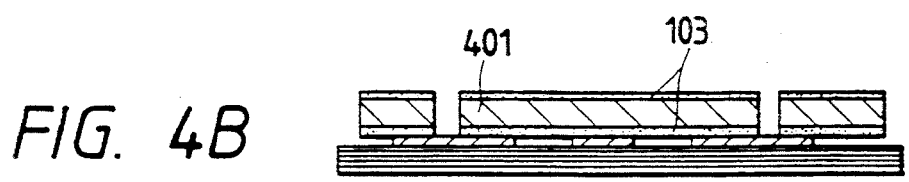
Figure 4C:
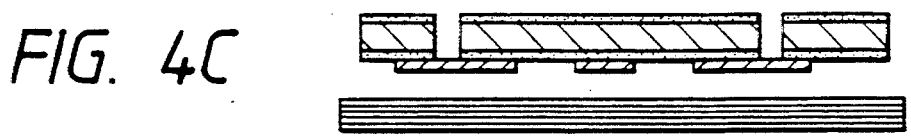
Figure 4D:
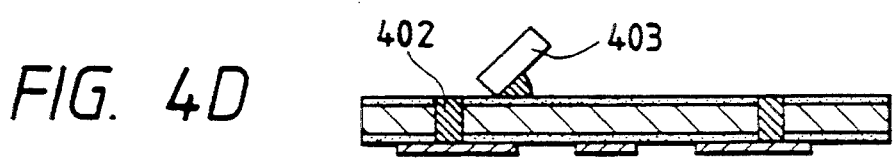
Figure 4E:
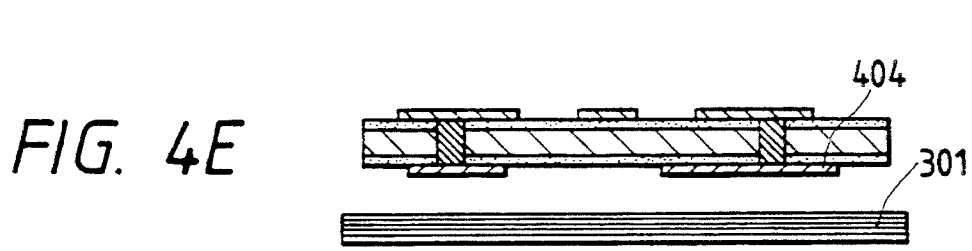

FIGS. 4A to 4E illustrate a flow sheet to show a process of fabricating such a double-sided sintered conductor circuit board prepared by transferring the sintered conductor to both sides of a resin support. FIGS. 4A to 4C are the same as FIGS. 3A to 3C except for making holes in the circuit board and also making use of a resin support 401 having adhesive layers 103 on its both sides. FIG. 4D shows the step of burying a conductive connecting material 402 in the resin support at its holes. The conductive connecting material 402 is rubbed in them by means of a squeegee 403. Thereafter, the steps shown in FIGS. 4A to 4C are once repeated to give a double-sided sintered conductor circuit board as shown in FIG. 4E. Reference numeral 404 denotes a sintered conductor provided on the back side. The conductive connecting material 402 may be comprised of a low-melting metal as exemplified by solder, or a paste incorporated with metal powder as exemplified by silver paste.

Figure 5:
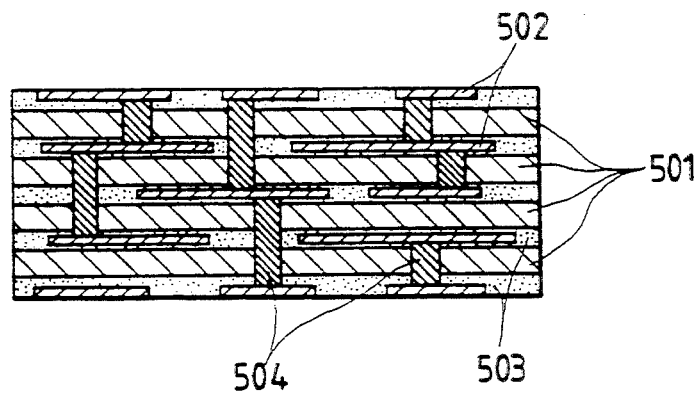
FIG. 5 is a cross section of a multi-layered sintered conductor circuit board according to the present invention.

FIG. 5 cross-sectionally illustrates a multi-layered sintered conductor circuit board according to the present invention. To the surfaces of a plurality of resin supports 501 in which holes have been made, sintered conductors 502 are respectively transferred by virtue of adhesive layers 503, and then the holes in the resin support are filled with a conductive connecting material 504. Thereafter, the respective resin supports 501 with the sintered conductors 502 are laminated. This multi-layered circuit board can be fabricated by superposing one another sheets of sintered conductor circuit boards having been processed up to the step of FIG. 4D and a sheet of double-sided sintered conductor circuit board having been processed up to the step of FIG. 4E, which are superposed with registration of holes and then hot-presses to give a laminate.

In the illustration in FIG. 5, the sintered conductors are buried in the adhesive layers. Such a configuration is obtained upon hot-pressing. This can give a mechanically strong multi-layered sintered conductor circuit board.

In the foregoing descriptions, the releasing substrate has a flat surface. Alternatively, the surface may be partly depressed or recessed so that any upper and lower sintered conductors in the multi-layered sintered conductor circuit board can be more surely connected.

Figure 6A:
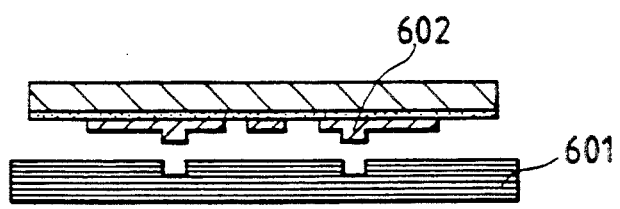
FIGS. 6A to 6B are cross sections to show the shape of a sintered conductor and how it is connected to other sintered conductor, in an instance in which part of the surface of a releasing substrate has been recessed.
Figure 6B:
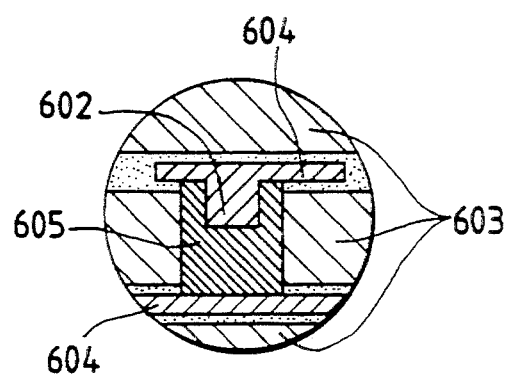

FIGS. 6A and 6B are cross sections to show the shape of a sintered conductor and how it is connected to other sintered conductor, in an instance in which part of the surface of a releasing substrate has been recessed. In FIG. 6A, reference numeral 601 denotes a releasing substrate provided with recesses on its surface. To this releasing substrate, the sinterable conductor paste as previously described is applied by screen printing or the like, followed by firing under the conditions as previously described. Subsequently, a resin support with holes positionally corresponding with the recesses is superposed on the releasing substrate having the conductor, which are then hot-pressed in the same manner as previously described. Then the resin support is peeled from the releasing substrate, so that the sintered conductor is transferred to the resin support. As a result, projections 602 are formed on the sintered conductor at its parts corresponding to the recesses of the releasing substrate. The holes of the resulting sintered conductor circuit board are filled with the conductive connecting material in the same manner as previously described. This circuit board is prepared in plurality. The plural circuit boards are superposed one another and then laminated by hot pressing with registration of the projections 602 to the holes to produce a multi-layered sintered conductor circuit board. These holes positionally correspond with the holes so made in the resin support as to enable electrical connection of the sintered conductors on the respective sintered conductor circuit boards. FIG. 6B is an enlarged view of the part at which a sintered conductor is connected to other sintered conductor. In FIG. 6B, reference numeral 603 denotes the resin support in which the holes have been made; 604, the sintered conductors; and 605, the conductive connecting material. Upon lamination of the circuit boards, the projections 602 made of the sintered conductor come through the holes and press against the conductive connecting material 605 to make the connection surer.

The projections 602 may also be provided by printing or the like on the sintered conductor 102 shown in FIG. 1.

The present invention will be described below in greater detail by giving Examples.

EXAMPLE 1

To a releasing substrate comprising a hexagonal boron nitride plate (trade name: TG-GRADE; available from Denka K.K.) with a flattened surface, a sinterable conductor paste having the composition as shown in Table 1 was applied by screen printing in stripe lines with a stripe width of 300 μm.

TABLE 1

| Composition of Conductor Paste | |
|---|---|
| Material components | Amount (% by weight) |
| Cu powder (1.7 μm)* | 79.9 |
| CuO (2.5 μm)* | 2.55 |
| Glass flit (1.9 μm)* | 2.55 |
| Vehicle (binder + solvent) | 15.5 |

TABLE 1-continued

| Composition of Conductor Paste | |
|---|---|
| Material components | Amount (% by weight) |
| Total | 100% by weight |

*average particle diameter

This conductor paste was prepared by adding to the above inorganic components 1.0 parts by weight of ethyl cellulose as a binder, a component of the vehicle, and dissolving them in 15 parts by weight of a solvent terpinenol to give a vehicle composition, followed by kneading using a three-roll mill.

The resulting printed stripe lines (circuit pattern) was dried at 120° C. for 10 minutes, and then fired in a mesh belt furnace in a nitrogen atmosphere. The firing was carried out under conditions of 900° C., which was maintained for 10 minutes, and for a period of 60 minutes from the time the substrate with the printed circuit pattern was put in the furnace to the time the fired product was withdrawn therefrom. As a result, a pattern of the sintered conductor (sintered copper) was formed in a good precision without separation of the pattern from the substrate. The sintered conductor pattern had a stripe width of about 300 μm, which underwent almost no widthwise shrinkage. The sintered conductor had a thickness of about 15 μm. A thicknesswise shrinkage was seen.

Next, a polyimide sheet with an epoxy adhesive (available from Toray Industries, Inc.; a cover-lay sheet for FPG (flexible printed circuit); hereinafter simply "polyimide sheet") was superposed on the above substrate with the sintered conductor in such a manner that part of the sintered conductor protrudes from an end of the polyimide sheet by about 1 mm, which were then hot-pressed at 160° C. After drying, the polyimide sheet was peeled to find that the sintered conductor had adhered to, i.e., transferred to, the polyimide sheet. The protruded portion of the sintered conductor was in the state of a finger-like projection, thus forming the commonly known TAB (tape automated bonding).

EXAMPLE 2

The procedure in Example 1 was repeated to form a sintered conductor stripes on the releasing substrate hexagonal boron nitride plate, except that the sintered conductor was made to have a three-layer structure comprised of a gold conductor, a copper conductor and a gold conductor in this order. The gold conductor layer was formed using a gold conductor paste prepared by adding the above vehicle to inorganic components comprised of 80% by weight of gold powder (average particle diameter: about 1 μm) and 1.0% by weight of glass flit (average particle diameter: about 1.9 μm). The copper conductor layer was formed using the same copper conductor paste as in Example 1. Both the pastes were superposingly applied by screen printing to the releasing substrate in order of gold, copper and gold.

The subsequent procedure in Example 1 was further repeated to give a sintered conductor of three-layer structure, except that the firing was carried out under conditions of 850° C. in a nitrogen atmosphere, which was maintained for 10 minutes.

The sintered conductor of three-layer structure thus prepared was transferred to the polyimide sheet in the same manner as in Example, to give a TAB structure having a finger covered with sintered gold.

EXAMPLE 3

To the surface of the same sintered conductor as prepared in Example 1 on the hexagonal boron nitride substrate, a solder flux was applied, followed by dipping in a molten solder. As a result, the sintered conductor, without separation from the substrate, had a surface on which the solder had been applied. This sintered conductor was transferred to the polyimide sheet in the same manner as in Example 1, to give a TAB structure having a finger provided with solder.

EXAMPLE 4

Circuit pattern of the sintered conductor was formed in the same manner as in Example 1. A polyimide sheet having holes at the desired positions was superposed thereon with registration, followed by hot pressing. Thereafter the sintered conductor was transferred to the polyimide sheet to give a sintered conductor circuit board. From the back of this sintered conductor circuit board, i.e. the side on which the sintered conductor is not provided, a thermoplastic binder resin silver paste was rubbed into the holes, and then the paste was dried. Another circuit pattern of the sintered conductor was also formed on that surface in the same manner as in Example 1, and the sintered conductor circuit board previously prepared was superposed thereon with registration, followed by hot pressing so that the sintered conductor was transferred. Thus the double-sided sintered conductor circuit board as shown in FIG. 4E was obtained. The sintered conductors on the both sides were electrically connected through the silver paste filled in the holes.

EXAMPLE 5

Using a releasing substrate comprising a hexagonal boron nitride substrate provided with recesses on its surface, the same sinterable conductor paste as used in Example 1 was applied by screen printing and firing in the same manner as in Example 1 to form a pattern of the sintered conductor on the releasing substrate. Subsequently, a polyimide sheet with holes positionally corresponding with the recesses was superposed thereon with registration, which were then hot-pressed in the same manner as in Example 1. Then the polyimide sheet was peeled from the releasing substrate, so that the sintered conductor was transferred to the resin support. As a result, projections as shown in FIG. 6 by reference numeral 602 were formed on the sintered conductor at its parts corresponding to the recesses of the releasing substrate. The holes of the resulting sintered conductor circuit board were filled with a conventionally known thermoplastic resin silver paste.

The foregoing procedure was repeated to prepare sintered conductor circuit boards of the same structure, which were superposed one another and then laminated by hot pressing in the same manner as in Example 1, with registration of the projections to the holes. A multi-layered sintered conductor circuit board having basically the same structure as shown in FIG. 5 was thus obtained. The respective layers of this multi-layered sintered conductor circuit board was confirmed to be perfect.

EXAMPLE 6

On an aluminum substrate, a graphite dispersion AQUADUG (trade name; available from Acheson Japan, Ltd.) was coated, followed by drying to produce a releasing substrate. On this releasing substrate, a Cu paste was patternwise printed, followed by drying, and then firing was carried out in the same manner as in Example 1. As a result, the graphite had disappeared and a pattern of the sintered conductor was obtained on the aluminum substrate. The same polyimide sheet as used in Example 1 was superposed thereon followed by hot pressing in the same manner as in Example 1, so that the sintered conductor was transferred to the polyimide sheet to give a sintered conductor circuit board.

EXAMPLE 7

Using as an inorganic component only copper powder having an average particle diameter of about 1 μm, a copper conductor paste was prepared by kneading the powder together with the same vehicle as used in Example 1. This cooper conductor paste was applied to the surface of an aluminum substrate by screen printing. The inorganic component of this conductor paste contained no additives for aiding adhesion to the substrate. The firing was carried out in the same manner as in Example 1. The sintered conductor thus formed was in a weak adhesion to the aluminum substrate, and hence, after the superposing of a polyimide sheet and hot pressing in the same manner as in Example 1, transferred to the polyimide sheet. Thus a sintered conductor circuit board was obtained.

As having been described above, the present invention makes it possible to obtain a high-density circuit board in a high precision. In addition, the circuit board can be obtained by a simple process, there is no step of causing industrial waste, and the fabrication equipment can be made compact, resulting in a low cost and high productivity.

What is claimed is:

1. A process for fabricating a sintered conductor circuit board, comprising the steps of patternwise applying a sinterable conductor paste to a releasing substrate to form a sinterable conductor pattern, sintering the sinterable conductor pattern at a temperature of from 600° C. to 1,000° C. to form a sintered conductor pattern on the releasing substrate, and transferring the sintered conductor pattern to a resin support.

2. A process for fabricating a sintered conductor circuit board according to claim 1, wherein said releasing substrate comprises hexagonal boron nitride (h-BN).

3. A process for fabricating a double-sided sintered conductor circuit board, comprising the steps of patternwise applying a sinterable conductor paste to a releasing substrate, to form a sinterable conductor pattern, sintering the sinterable conductor pattern at a temperature of from 600° C. to 1,000° C. to form a sintered conductor pattern on the releasing substrate, and then transferring the sintered conductor pattern to both sides of a resin support having a hole made therein, said hole being filled with a conductive connecting material after said sintered conductor pattern has been transferred to one side of said resin support.

4. A process for fabricating a double-sided sintered conductor circuit board according to claim 3, wherein said releasing substrate is provided with a recess in such a way that part of said sintered conductor come into said hole of said resin support.

5. A process for fabricating a double-sided sintered conductor circuit board according to claim 3, wherein said releasing substrate comprises hexagonal boron nitride (h-BN).

6. A process for fabricating a multi-layered sintered conductor circuit board, comprising the steps of patternwise applying a sinterable conductor paste to a releasing substrate, to form a sinterable conductor pattern, sintering the sinterable conductor pattern at a temperature of from 600° C. to 1,000° C. to form a sintered conductor pattern on the releasing substrate, transferring the sintered conductor pattern to one side of a resin support having a hole made therein to form a sintered conductor circuit board, filling said hole of said resin substrate of said circuit board with a conductive connecting material, and laminating to the resulting sintered conductor circuit board at least one other sintered conductor circuit board fabricated by repeating said steps of fabricating said sintered conductor circuit board.

7. A process for fabricating a multi-layered sintered conductor circuit board according to claim 6, wherein said releasing substrate is provided with a recess in such a way that part of said sintered conductor come into said hole of said resin support.

8. A process for fabricating a sintered conductor circuit board according to claim 6, wherein said releasing substrate comprises hexagonal boron nitride (h-BN).

9. A process for fabricating a double-sided sintered conductor circuit board according to claim 4, wherein said releasing substrate comprises hexagonal boron nitride (h-BN).

10. A process for fabricating a sintered conductor circuit board according to claim 7, wherein said releasing substrate comprises hexagonal boron nitride (h-BN).

* * * * *